(12) United States Patent
Bailey et al.

(10) Patent No.: US 7,573,417 B2
(45) Date of Patent: Aug. 11, 2009

(54) MULTI-BIT PER STAGE PIPELINED ANALOG TO DIGITAL CONVERTERS

(75) Inventors: James A. Bailey, Snowflake, AZ (US); Mingdeng Chen, Cupertino, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/025,914

(22) Filed: Feb. 5, 2008

(65) Prior Publication Data

US 2009/0128389 A1 May 21, 2009

Related U.S. Application Data

(60) Provisional application No. 60/989,404, filed on Nov. 20, 2007.

(51) Int. Cl.
*H03M 1/38* (2006.01)
(52) U.S. Cl. .................................. 341/161; 341/155
(58) Field of Classification Search .................. 341/155, 341/156, 161, 159
See application file for complete search history.

(56) References Cited

U.S. PATENT DOCUMENTS

| | | | |
|---|---|---|---|
| 6,784,824 B1 | 8/2004 | Quinn | |
| 6,956,519 B1 | 10/2005 | Huang | |
| 7,002,504 B2 * | 2/2006 | McMahill | 341/161 |
| 7,209,068 B1 | 4/2007 | Chen et al. | |
| 7,471,228 B2 | 12/2008 | Cho | |

2006/0071709 A1 * 4/2006 Maloberti et al. .............. 330/9

OTHER PUBLICATIONS

Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Daito et al., "A 14-bit 20-MS/s Pipelined ADC With Digital Distortion Calibration," IEEE J. Solid-State Circuits, vol. 41, No. 11, pp. 2417-2423, Nov. 2006.
Gupta et al., "A 1GS/s 11b Time Interleaved ADC in 0.13um CMOS", ISSCC Dig. Tech. Papers, pp. 576-577, Feb. 2006.
Kim et al., "A 10-b, 10MS/s CMOS A/D Converter", IEEE J. Solid State Circuits, vol. 32, No. 3, pp. 302-311, Mar. 1997.
Mehr et al., "A 55-mW, 10-bit, 40-Msample/s Nyquist-Rate CMOS ADC," IEEE J. Solid-State Circuits, vol. 35, No. 3, pp. 302-311, Mar. 2000.
Nagaraj et al., "A 250 mW 8-b, 52 Msamples/s Parallel-pipelined A/D Converter with Reduced Number of Amplifiers", IEEE J. Solid State Circuits, vol. 32,pp. 312-320, Mar. 1997.

(Continued)

*Primary Examiner*—Brian Young
(74) *Attorney, Agent, or Firm*—Hamilton, DeSanctis & Cha

(57) ABSTRACT

Various embodiments of the present invention provide systems and circuits that provide for conversion of analog signals to digital signals. For example, various embodiments of the present invention provide pipelined analog to digital converters. Such converters include a sub-converter and a residue amplifier. The sub-converter receives an analog input, and provides a digital representation of the analog input including a number of bits. A gain of the residue amplifier is controlled by selectably setting a group of switches. Each of the number of bits output from the sub-converter electrically controls a respective one of the switches.

20 Claims, 3 Drawing Sheets

OTHER PUBLICATIONS

Singer et al., "A 14-bit 10-MHz calibration-free CMOS pipelined A/D converter," in symp. VLSI Circuits Dig. Tech. Papers, Jun. 1996, pp. 38-39.

U.S. Appl. No. 12/024,893, filed Feb. 1, 2008, Bailey.
U.S. Appl. No. 12/024,909, filed Feb. 1, 2008, Bailey.
U.S. Appl. No. 12/025,897, filed Nov. 20, 2007, Bailey et al.

* cited by examiner

MULTI-BIT PER STAGE PIPELINED ANALOG TO DIGITAL CONVERTERS

CROSS REFERENCE TO RELATED APPLICATIONS

The present application claims priority to (is a non-provisional of) U.S. Provisional Patent Application No. 60/989,404 entitled "Systems and Methods for Multi-bit Per Stage Analog to Digital Conversion", and filed Nov. 20, 2007 by Bailey et al. The entirety of the aforementioned application is incorporated herein by reference for all purposes.

BACKGROUND OF THE INVENTION

The present invention is related to electronic signal conversion, and more particularly to pipelined analog to digital converters.

Pipelined analog to digital converters are one of the most popular analog to digital conversion architectures for medium to high speed conversions. One of the trends in the art has been to decrease the number of bits per stage in the pipeline to reduce any gain-bandwidth requirements of the pipeline residue amplifiers. However, fewer bits per stage increases the number of stages required for a given resolution. In addition, a more serious drawback is that fewer bits per stage increases the sensitivity to component matching errors.

Further, previous multi-bit-per-stage pipelined ADC sub-stages use a larger number of comparators than that required for the desired gain. Depending on the number of comparators and the sampling capacitors, either a decoder is inserted between the comparators and the switches in the Multiplying Digital-to-Analog Converters (MDACs) or a large number of capacitors units are used in the MDAC. The decoder introduces delay and the large number of capacitor units worsens the matching, increases the routing parasitics, and even reduces the feedback factor sometimes. All of these require faster residue amplifiers and leads to less linear analog to digital converters.

Hence, for at least the aforementioned reasons, there exists a need in the art for advanced systems, circuits and methods for electronic signal conversion.

BRIEF SUMMARY OF THE INVENTION

The present invention is related to electronic signal conversion, and more particularly to pipelined analog to digital converters.

Various embodiments of the present invention provide systems and circuits that provide for conversion of analog signals to digital signals. For example, various embodiments of the present invention provide pipelined analog to digital converters. Such converters include a sub-converter and a residue amplifier. The sub-converter receives an analog input, and provides a digital representation of the analog input including a number of bits. A residue calculation is controlled by selectably setting a group of switches. Each of the number of bits output from the sub-converter electrically controls a respective one of the switches.

Other embodiments of the present invention provide pipelined analog to digital converters that include analog to digital converter stages. The analog to digital converter stages include a multi-bit analog to digital converter with a particular number of comparators, and a digital to analog converter that is directly controlled by outputs from the particular number of comparators. In various cases, the digital to analog converter includes a residue amplifier with a feedback capacitance and an input capacitance. The input capacitance includes the particular number of input capacitors. Each of the particular number of input capacitors may be switchably coupled to a positive reference voltage or a negative reference voltage via respective switches. In such cases, each of the switches may be controlled by an output of a respective one of the comparators. In some cases, the gain of the residue amplifier is a power of two, and in one particular case, the particular number of comparators is four, and the gain of the residue amplifier is four.

Yet other embodiments of the present invention provide pipelined analog to digital converters that include two or more analog to digital converter stages. Each of the analog to digital converter stages provides a multi-bit digital output and an analog residue. The analog residue for one stage drives an input of the other stage. One of the analog to digital converter stages includes a multi-bit analog to digital converter with a first particular number of comparators. The first particular number comparators drive the multi-bit digital output of the stage. The stage further includes a digital to analog converter that is directly controlled by outputs from the first particular number of comparators. The other analog to digital converter stage includes another multi-bit analog to digital converter with a second particular number of comparators. The second particular number of comparators drive the multi-bit digital output of the stage. The stage further includes a digital to analog converter that is directly controlled by outputs from the second particular number of comparators. In some cases, the first particular number is equivalent to the second particular number, and in other cases the first particular number is different from the second particular number. In one particular case, both the first and the second particular numbers are four.

In some instances of the aforementioned embodiments, the digital to analog converter of the first stage includes a residue amplifier with a feedback capacitance and an input capacitance. In such cases, the input capacitance may include a number of capacitors equivalent to the first particular number. Each of the first particular number of input capacitors may be switchably coupled to a positive Reference voltage or a negative Reference voltage via respective switches, and each of the switches may be controlled by an output of a respective one of the first particular number of comparators. In some cases, the gain of the residue amplifier is a power of two (e.g., 2, 4, 8, ... ).

Similarly, the digital to analog converter of the second stage may include a residue amplifier with a feedback capacitance and an input capacitance. In such cases, the input capacitance may include a number of capacitors equivalent to the second particular number. Each of the second particular number of input capacitors may be switchably coupled to a positive Reference voltage or a negative Reference voltage via respective switches, and each of the switches may be controlled by an output of a respective one of the second particular number of comparators. In some cases, the gain of the residue amplifier is again a power of two.

Yet further embodiments of the present invention provide electronic devices that include an analog signal, a digital signal, and a pipelined analog to digital converter. The pipelined analog to digital converter receives the analog signal and provides the digital signal. The pipelined analog to digital converter includes at least a first analog to digital converter stage and a second analog to digital converter stage. The first analog to digital converter stage provides a first multi-bit digital output and a first analog residue, and an input of the first analog to digital converter stage is driven by the analog signal. The first analog to digital converter stage includes: a first multi-bit analog to digital converter with a first particular number of comparators that drive the first multi-bit digital output, and a first digital to analog converter that is directly controlled by outputs from the first particular number of comparators. The second analog to digital converter stage provides a second multi-bit digital output and a second analog residue, and an input of the second analog to digital converter stage is driven by the first analog residue. The second analog to digital converter stage includes: a second multi-bit analog to digital converter with a second particular number of comparators that drive the second multi-bit digital output, and a second digital to analog converter that is directly controlled by outputs from the second particular number of comparators. The digital output is a combination of the first multi-bit digital output and the second multi-bit digital output. The electronic device may be, but is not limited to, a cellular telephone, a satellite receiver, a hard disk drive, or a digital radio.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to electronic signal conversion, and more particularly to pipelined analog to digital converters.

Various embodiments of the present invention provide analog to digital converters that include the same number of comparators as the desired gain of the sub-stage of multi-bit-per-stage pipelined analog to digital converters. Thus, the outputs of the comparators (i.e., a thermometer code) can be used directly to control the switches in the MDACs. This eliminates the need for a decoder or encoder between the comparators and the switches. As some advantages, the settling time of the residue amplifier can be increased as the delay through the decoder or encoder is eliminated. Further, a reduced number of capacitors may be used allowing for easier matching, and an improvement in the feedback factor. Yet further, a faster and more linear analog to digital conversion may be achieved where the decoder or encoder is eliminated.

In a pipelined analog to digital converter, one stage performs a analog to digital conversion of an input signal. The conversion is somewhat coarse and results in a residue that is not convertible at the resolution of stage. The residue is converted back to an analog signal using a digital to analog converter, and the analog signal is amplified by a residue amplifier before an analog conversion is performed on the amplified residue by a subsequent stage. One significant error source in pipelined analog to digital converters are errors from the reconstruction digital to analog converters, and the inter-stage gain errors introduced by the residue amplifiers.

Various embodiments of the present invention utilize a closed-loop switch capacitor gain stage for the residue amplification. The accuracy of the gain is limited by the matching of the sampling and feedback capacitors, and various embodiments of the present invention offer good matching across capacitors. This good matching yields improved conversion linearity. Further, the residue amplifier in some cases is a bottleneck of the speed of the pipelined analog to digital converter. Some embodiments of the present invention operate without an encoder or decoder between the output of the digital to analog converter and switches controlling the gain of the residue amplifier. This reduces the time required to set up the residue amplifier, and thus relaxes the time requirements for the residue amplifier to perform its amplification and to settle. In some embodiments of the present invention, this results in an increased bandwidth for the amplifier.

Figure 1A:
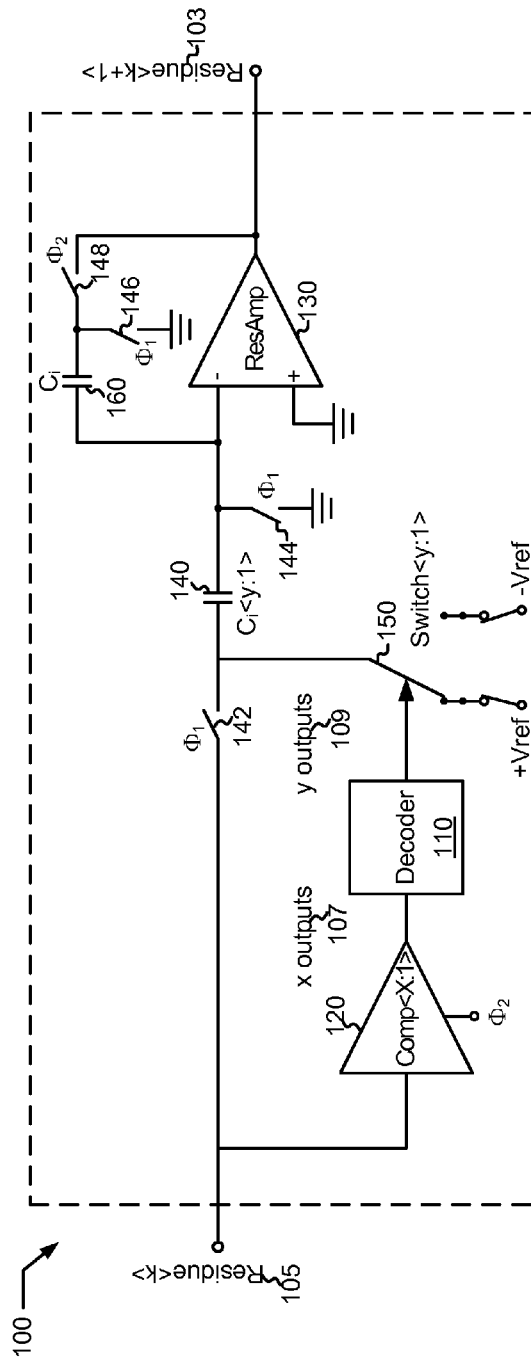
FIG. 1a shows a prior art example of one stage of a pipelined analog to digital converter that utilizes a decoder to decode the outputs from the digital to analog converter.

Turning to FIG. 1, a prior art example of one stage 100 of a pipelined analog to digital converter is shown that utilizes a decoder 110 to decode the outputs from the digital to analog converter 120. In particular, converter 120 includes x comparators that receive a residue input 105 from a preceding stage (or the original input voltage where the stage is the first stage in multiple stage pipeline), and provide an x-bit output 107 to decoder 110 that converts x-bit output 107 to a y-bit output 109 where x is not equal to y. Each bit of y-bit output 109 is provided to control a respective one of y-switches 150. Switches 150 control the switching of capacitors 140 associated with the gain of a residue amplifier 130. Residue amplifier 130 provides a residue output 103 to a subsequent stage.

It should be noted that the x comparators are used in converter 120 result in an x-bit output that, without conversion, is incompatible with the number of switches 150 that are used to control the charging of input capacitors 140. Because of this, decoder 110 is necessary to decode x-bit output 107 into y-bit output 109 that is compatible with the number of switches 150 that are used to control the charging of input capacitors 140. The time required by decoder 110 reduces the time budget allowed for operating switches 150 and settling residue amplifier 130 before residue output 103 is to be made available to a subsequent stage.

As a particular example, assume that stage 100 is implemented is a 2.8-bit sub-stage (which resolves 2-effective bits) of a pipelined analog to digital converter. For a uniform maximum signal swing in an incorporating analog to digital converter, the desired gain of stage 100 is four. Also assuming that each of input capacitors 140 is equal to feedback capacitor 160, then the value of y is four. Since there are six comparators in converter 120 (i.e., x=6), decoder 110 is needed between the x-bit output 107 of converter 120 and the y-switches 150.

Figure 1B:
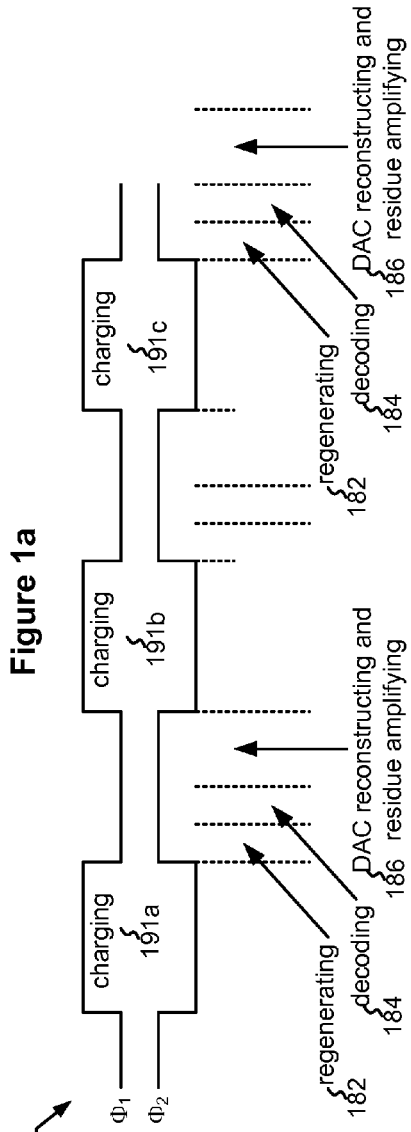
FIG. 1b is a timing diagram depicting the operational timing of the stage of FIG. 1.

Turning to FIG. 1b, a timing diagram 180 shows an exemplary operational timing of stage 100. As shown, during a charging period 191 of signal Φ1, input capacitors 140 are charged to the value of residue input 105 as switches 142, 144, 146 are closed. During a regeneration period 182, decoding period 184 and amplification period 186 of signal Φ2, switches 142, 144, 146 are opened, and capacitors 140 are discharged through a charge transfer to a feedback capacitor 160 as switch 148 is closed. During regeneration period 182 of signal Φ2, converter 120 initially performs a comparison and x-bit output is 107 regenerated. A decoding period 184 follows where the stable x-bit output 107 are decoded and passed to switches 150 as y-bit output 109. With y-bit output 109 stable, a reliable reconstructing digital to analog conversion can be performed along with residue amplification 186. As can be seen from timing diagram 180, the delay through decoder 110 reduces the time budget for the digital to analog converter reconstruction and the residue amplification. This results in a more restrictive requirement for the speed of residue amplifier 130, or undesirable bandwidth limitations on stage 100.

Figure 2:
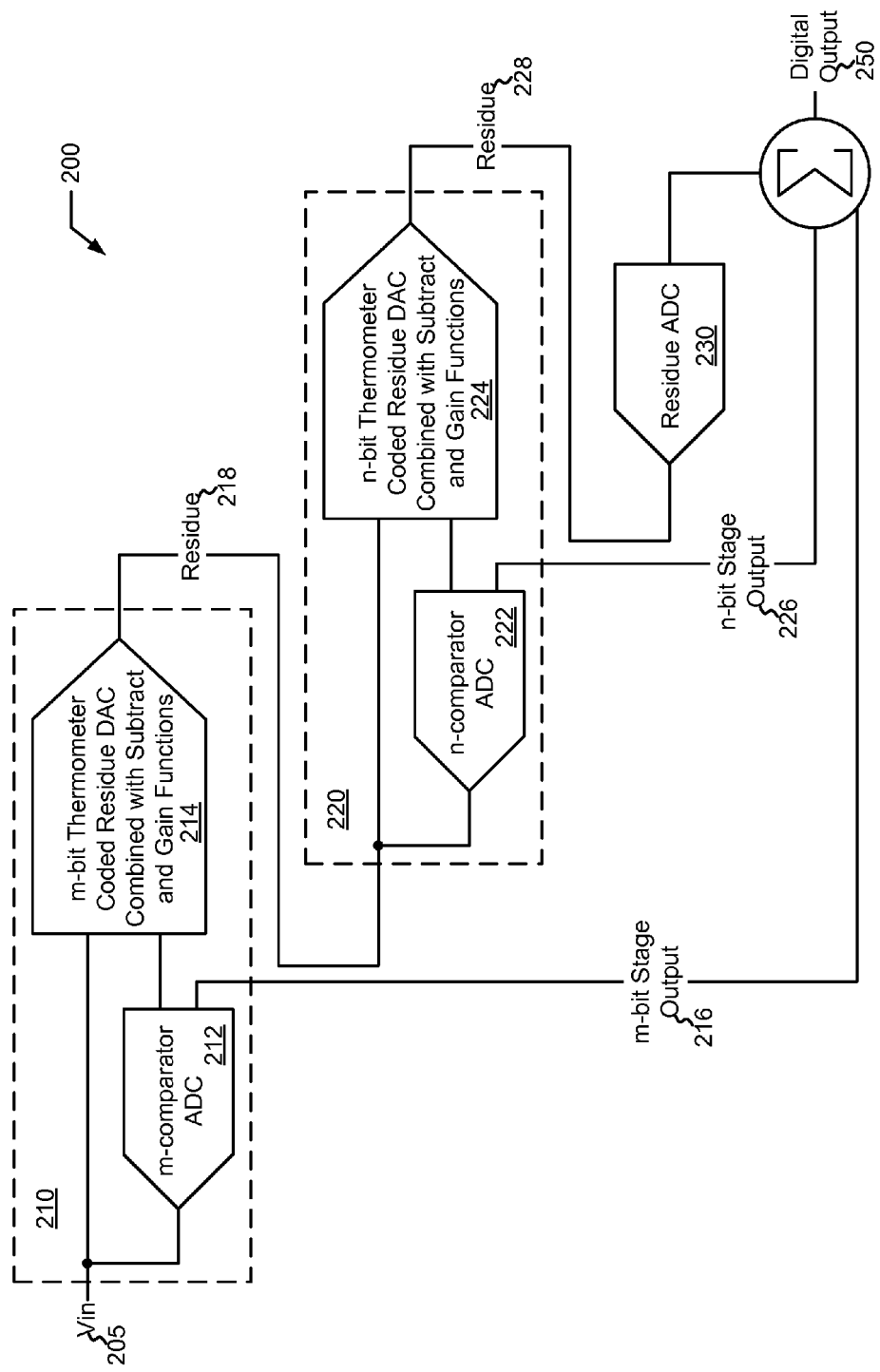
FIG. 2 depicts a pipelined analog to digital converter in accordance with various embodiments of the present invention.

Turning to FIG. 2, a pipelined analog to digital converter 200 is depicted in accordance with various embodiments of the present invention. Pipelined analog to digital converter 200 is shown as including three stages 210, 220, 230. Both stage 210 and stage 220 include an analog to digital converter provides a thermometer code that directly drives switched gain capacitors in a subsequent digital to analog converter. In particular, stage 210 includes an analog to digital converter 212 that includes m-comparators. Analog to digital converter 212 produces an m-bit stage output 216 that is also used as an m-bit thermometer code to drive a digital to analog converter 214. Digital to analog converter 214 includes m-switches that control a gain function used to generate a residue output 218 that is provided to stage 220. Similarly, stage 220 includes an analog to digital converter 222 that includes n-comparators. Analog to digital converter 222 produces an n-bit stage output 226 that is also used as an n-bit thermometer code to drive a digital to analog converter 224. Digital to analog converter 224 includes n-switches that control a gain function used to generate a residue output 228 that is provided to stage 230. In some cases, the values for m and n are the same, while in other cases they may be different. The values of m and n may be chosen depending upon known design tradeoffs governing the implementation of pipelined analog to digital converters.

Residue output 228 is provided to a residue analog to digital converter 230. Residue analog to digital converter 230 operates to perform an analog to digital conversion of residue output 228, and to provide the resulting digital value that is combined with m-bit stage output 216 and n-bit stage output 226 to provide a digital output 250. It should be noted that while pipelined analog to digital converter 200 is shown to include three stages, that other embodiments of the present invention may provide analog to digital converters with more or fewer stages.

Figure 3A:
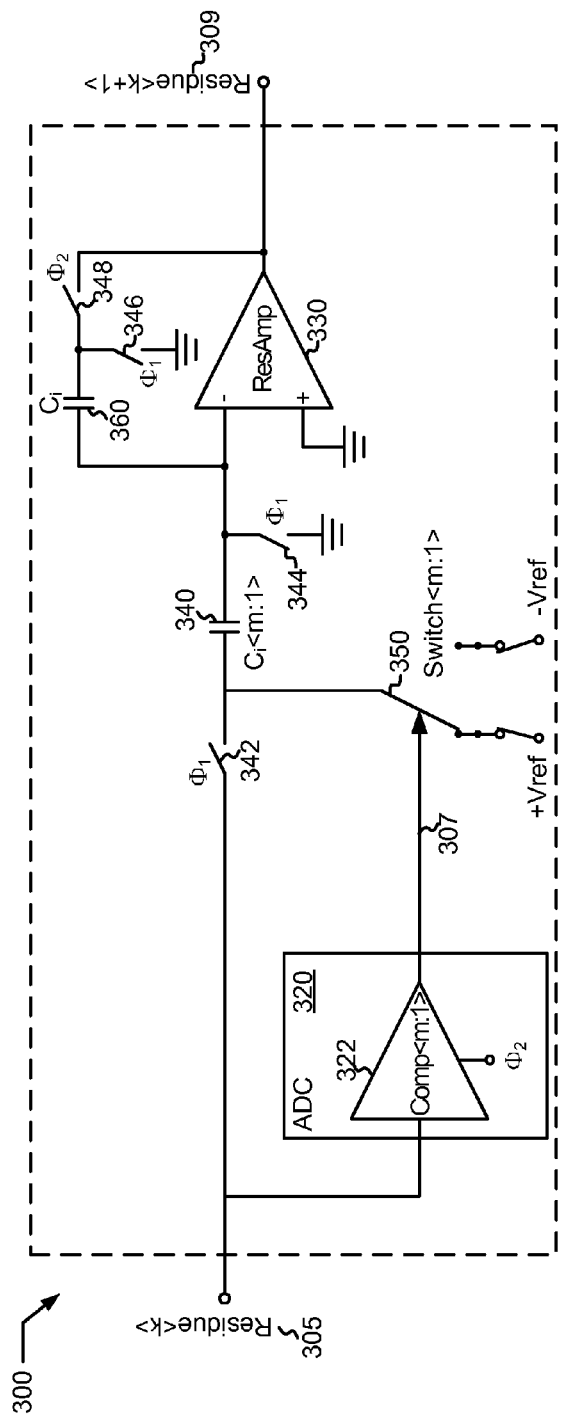
FIG. 3a depicts one stage of a pipelined analog to digital converter in accordance with one or more embodiments of the present invention where the output of the digital to analog converter is passed directly to switches controlling the gain of the residue amplifier.

Turning to FIG. 3, an example of one stage 300 of a pipelined analog to digital converter is shown in accordance with various embodiments of the present invention. Stage 300 may be used in place of one or both of stages 210, 220 of pipelined analog to digital converter 200. Stage 300 includes an analog to digital converter 320 that includes m comparators 322 that receive a residue input 305 from a preceding stage (or the original input voltage where the stage is the first stage in multiple stage pipeline), and provide an m-bit output 307 directly to m switches 350. In particular, each bit of m-bit output 307 controls a respective one of the m switches 350. Switches 350 control the switching of capacitors 140 associated with the gain of a residue amplifier 130. Residue amplifier 130 provides a residue output 103 to a subsequent stage. As one advantage of embodiments of the present invention, the time budget allowed for resolving residue amplifier 130 is increased by eliminating time required to resolve a mismatch between the number of comparators 322 and the number of switches 350. It should be noted that the value of m may be different for different embodiments of the present invention. Further, as in the case of pipelined analog to digital converter 200, the value of m may be different between different pipeline stages.

Figure 3B:
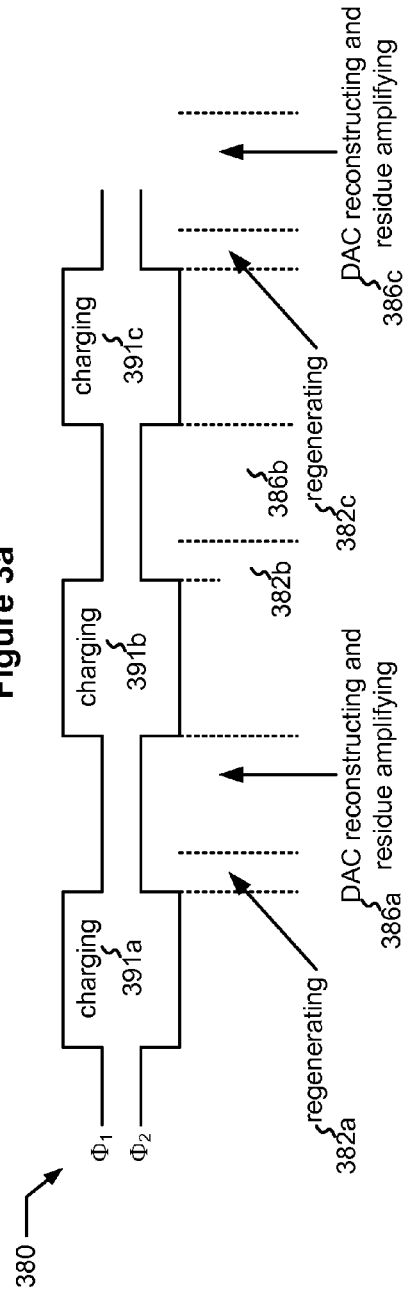
FIG. 3b is a timing diagram depicting the operational timing of the stage of FIG. 3.

Turning to FIG. 3b, a timing diagram 380 shows an exemplary operational timing of stage 300. As shown, during a charging period 391 of signal Φ1, input capacitors 140 are charged to the value of residue input 305 as switches 342, 344, 346 are closed. During a regeneration period 382 and amplification period 386 of signal Φ2, switches 342, 344, 346 are opened, and capacitors 340 are discharged through a charge transfer to a feedback capacitor 360 as switch 348 is closed. During regeneration period 382 of signal Φ2, analog to digital converter 320 initially performs a comparison and m-bit output 307 is regenerated. With m-bit output 307 stable, a reliable reconstructing digital to analog conversion can be performed along with residue amplification period 386. As can be seen from timing diagram 380, the time budget for digital to analog converter reconstruction and the residue amplification 386 is increased when compared with the prior art. This results in a less restrictive requirement for the speed of residue amplifier 330, and a desirable bandwidth capability of stage 300.

As an example, stage 300 may be implemented as a 2.8-bit sub-stage (which resolves 2-effective bits) of a pipelined analog to digital converter using six comparators (i.e., m=6). For a uniform maximum signal swing in an incorporating analog to digital converter, the desired gain of stage 300 is four. In such a case, each of input capacitors 340 are two capacitor units, while feedback capacitor 260 is three capacitor units. This allows for the same ratios of input capacitors 340 to feedback capacitors 360, yet controlling the capacitors using six switches 350. In this case, fifteen total capacitors (i.e., twelve input capacitors 340 and three feedback capacitors 360) are utilized. This increase in capacitors may result in more complicated routing, and poorer matching between capacitors. Further, the routing parasitics will be much larger. All of these require faster residue amplifiers and lead to less linear analog to digital converters.

Thus, in some embodiments of the present invention, a particular sub-stage resolution may be chosen to reduce the number of required capacitor units while maintaining the same number of comparators 322 and switches 350. In this way, the aforementioned difficulties are reduced along with an increase in the time budget for reconstructing digital to analog conversion can be performed along with residue amplification 386. As a particular example where a two effective bit stage is desired with a residue amplifier with a gain of four, four comparators (i.e., comparators 322) and four capacitors (i.e., capacitors 340) may be used. In such a case, each of capacitors 340 and feedback capacitor 360 exhibit the same unit capacitance and can be implemented using a total of five capacitors (i.e., four capacitors 340 and one capacitor 360). This reduction in capacitors eliminates the above mentioned problems, and provides the advantage of one to one correspondence between the number of comparators 322 and the number of switches 350. In such a case, the four comparators 322 offer five distinct ranges that correspond to the five distinct ranges available on input capacitors 340 through control of switches 350. More particularly, the five distinct levels available on input capacitors 340 are: (a) −2Vref, (b) −Vref, (c) zero, (d) +Vref, and (e) +2Vref.

In conclusion, the invention provides novel systems, circuits, methods and arrangements for converting an analog signal to a digital signal. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A pipelined analog to digital converter, wherein the pipelined analog to digital converter comprises:
   an analog to digital converter stage, wherein the analog to digital converter stage includes:
      a multi-bit analog to digital converter, wherein the multi-bit analog to digital converter includes a particular number of comparators; and
      a digital to analog converter, wherein the digital to analog converter is controlled by outputs from the particular number of comparators, wherein the digital to analog converter includes a residue amplifier with a feedback capacitance and an input capacitance, and wherein the input capacitance includes the particular number of input capacitors; and
   wherein the resolution of the analog to digital converter stage is selected to reduce the number of capacitor units.

2. The pipelined analog to digital converter of claim 1, wherein each of the particular number of input capacitors is switchably coupled to a positive reference voltage or a negative reference voltage via respective switches.

3. The pipelined analog to digital converter of claim 2, wherein each of the switches is controlled by an output of a respective one of the comparators.

4. The pipelined analog to digital converter of claim 3, wherein the gain of the residue amplifier is a power of two.

5. The pipelined analog to digital converter of claim 4, wherein the particular number of comparators is four, and wherein the gain of the residue amplifier is four.

6. The pipelined analog to digital converter of claim 1, wherein the particular number of comparators is four.

7. The pipelined analog to digital converter of claim 1, wherein the digital to analog converter includes a residue amplifier with a gain of four.

8. The pipelined analog to digital converter of claim 1, wherein the analog to digital converter stage is a first analog to digital converter stage, wherein the multi-bit analog to digital converter is a first multi-bit analog to digital converter, wherein the particular number is a first particular number, wherein the digital to analog converter is a first digital to analog converter, and wherein the analog to digital converter further comprises:
   a second analog to digital converter stage, wherein an input of the second analog to digital converter stage is an output of the first analog to digital converter stage, and wherein the second analog to digital converter stage includes:
   a second multi-bit analog to digital converter, wherein the second multi-bit analog to digital converter includes a second particular number of comparators; and
   a second digital to analog converter, wherein the second digital to analog converter is directly controlled by outputs from the second particular number of comparators.

9. The pipelined analog to digital converter of claim 8, wherein the first particular number and the second particular number are equivalent.

10. A pipelined analog to digital converter, wherein the pipelined analog to digital converter comprises:
   a first analog to digital converter stage, wherein the first analog to digital converter stage provides a first multi-bit digital output and a first analog residue, and wherein the first analog to digital converter stage includes:
   a first multi-bit analog to digital converter, wherein the first multi-bit analog to digital converter includes a first particular number of comparators, and drives the first multi-bit digital output; and
   a first digital to analog converter, wherein the first digital to analog converter is directly controlled by outputs from the first particular number of comparators, wherein the first digital to analog converter includes a residue amplifier with a feedback capacitance and an input capacitance, and wherein the input capacitance includes the particular number of input capacitors; and
   wherein the resolution of the first analog to digital converter stage is selected to reduce the number of capacitor units;
   a second analog to digital converter stage, wherein the second analog to digital converter stage provides a second multi-bit digital output and a second analog residue, wherein an input of the second analog to digital converter stage is driven by the first analog residue, and wherein the second analog to digital converter stage includes:
   a second multi-bit analog to digital converter, wherein the second multi-bit analog to digital converter includes a second particular number of comparators, and drives the second multi-bit digital output; and
   a second digital to analog converter, wherein the second digital to analog converter is directly controlled by outputs from the second particular number of comparators.

11. The pipelined analog to digital converter of claim 10, wherein the first particular number is different from the second particular number.

12. The pipelined analog to digital converter of claim 10, wherein the first particular number is four and the second particular number is four.

13. The pipelined analog to digital converter of claim 10, wherein the first digital to analog converter comprises:
   a residue amplifier with a feedback capacitance and an input capacitance, and wherein the input capacitance includes the first particular number of input capacitors.

14. The pipelined analog to digital converter of claim 13, wherein each of the first particular number of input capacitors is switchably coupled to a positive reference voltage or a negative reference voltage via respective switches.

15. The pipelined analog to digital converter of claim 14, wherein each of the switches is controlled by an output of a respective one of the first particular number of comparators.

16. The pipelined analog to digital converter of claim 15, wherein the gain of the first residue amplifier is a power of two.

17. An electronic device, wherein the electronic device comprises:
   an analog signal;
   a digital signal;
   a pipelined analog to digital converter, wherein the pipelined analog to digital converter receives the analog signal and provides the digital signal, and wherein the pipelined analog to digital converter comprises:
   a first analog to digital converter stage, wherein the first analog to digital converter stage provides a first multi-bit digital output and a first analog residue, wherein an input of the first analog to digital converter stage is driven by the analog signal, and wherein the first analog to digital converter stage includes:

a first multi-bit analog to digital converter, wherein the first multi-bit analog to digital converter includes a first particular number of comparators, and drives the first multi-bit digital output; and a first digital to analog converter, wherein the first digital to analog converter is directly controlled by outputs from the first particular number of comparators, wherein the first digital to analog converter includes a residue amplifier with a feedback capacitance and an input capacitance, and wherein the input capacitance includes the particular number of input capacitors; and wherein the resolution of the first analog to digital converter stage is selected to reduce the number of capacitor units;

a second analog to digital converter stage, wherein the second analog to digital converter stage provides a second multi-bit digital output and a second analog residue, wherein an input of the second analog to digital converter stage is driven by the first analog residue, and wherein the second analog to digital converter stage includes:

a second multi-bit analog to digital converter, wherein the second multi-bit analog to digital converter includes a second particular number of comparators, and drives the second multi-bit digital output; and a second digital to analog converter, wherein the second digital to analog converter is directly controlled by outputs from the second particular number of comparators; and wherein the digital output is a combination of the first multi-bit digital output and the second multi-bit digital output.

18. The electronic device of claim 17, wherein the first particular number is the same as the second particular number.

19. The electronic device of claim 17, wherein the electronic device is selected from a group consisting of: a cellular telephone, a satellite receiver, a hard disk drive, and a digital radio.

20. The pipelined analog to digital converter of claim 1, wherein an overall capacitance of the number of capacitor units is the same as the overall capacitance of the combination of the feedback capacitance and the input capacitance.

* * * * *